United States Patent
Jacobson et al.

(10) Patent No.: US 7,659,742 B1
(45) Date of Patent: Feb. 9, 2010

(54) VACUUM CHAMBER AC/DC PROBE

(75) Inventors: Steven Jacobson, Dublin, CA (US); Duc huu Nguyen, San Jose, CA (US); Zachary Gemmill, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/893,761

(22) Filed: Aug. 17, 2007

Related U.S. Application Data

(60) Provisional application No. 60/922,474, filed on Apr. 9, 2007.

(51) Int. Cl.
  *G01R 31/26* (2006.01)
(52) U.S. Cl. ........................................ 324/765
(58) Field of Classification Search ......... 324/750–752, 324/754, 761–762, 765, 158.1
See application file for complete search history.

(56) References Cited

U.S. PATENT DOCUMENTS

| | | | | |
|---|---|---|---|---|
| 5,321,363 A | * | 6/1994 | Wakamatsu et al. | 324/523 |
| 5,742,172 A | * | 4/1998 | Yasutake | 324/754 |
| 6,211,686 B1 | * | 4/2001 | Matsuzawa et al. | 324/719 |
| 6,888,135 B2 | * | 5/2005 | Naitou et al. | 250/306 |

* cited by examiner

*Primary Examiner*—Ha Tran T Nguyen
*Assistant Examiner*—Tung X Nguyen
(74) *Attorney, Agent, or Firm*—Dergosits & Noah LLP

(57) ABSTRACT

Features of non-vacuum AC/DC probe systems are combined with features of the DC vacuum chamber testers to provide an AC/DC probe system that can be used in a vacuum environment, such as a SEM vacuum chamber. Features of the DC vacuum chamber tester are modified to include new op-amp circuitry that provides the AC/DC testing functionality of the non-vacuum chamber systems, resulting in an AC/DC probe system that can be used in a vacuum environment.

7 Claims, 5 Drawing Sheets

VACUUM CHAMBER AC/DC PROBE

PRIORITY CLAIM

This application claims the benefit of U.S. Provisional Application No. 60/922,474, filed on Apr. 9, 2007, by Jacobson et al. and titled "Vacuum Chamber AC/DC Probe." Provisional Application No. 60/922,474 is hereby incorporated by reference herein in its entirety

FIELD OF THE INVENTION

The present invention relates to the testing of electrical circuits and, in particular, to systems and methods for implementing high impedance, low capacitance vacuum chamber probing of such circuits.

DISCUSSION OF THE RELATED ART

Test systems are available for acquiring AC and DC signals from electrical circuits. One such test system, the Pico-Probe® Model 12C (available from GGB Industries Inc.), consists of a power supply, gain/calibration adjustment, DC offset, an operational amplifier (op-amp) probe arm and a dedicated probe tip. A DC offset is needed to accurately measure peak-to-peak voltage levels when the oscilloscope is in DC mode. A device may need mV accurate calibration to reference nodes such as Gnd, Vref or other analog levels.

These AC/DC systems are configured for use only with "open-air" non-vacuum probe stations. The PicoProbe Model 12C is available with probe tips of 100 nm diameter or greater and with a maximum bandwidth of 500 MHz. Thus, these systems are not suitable for high speed testing in a vacuum environment, such as in a scanning electron microscope (SEM) environment.

Systems, such as the IC Nanoprober System (available from Zyvex Corporation), are available for testing circuits within a vacuum chamber using a four probe head. However, these systems are only capable of DC probing, typically at the transistor level. Although the IC Nanoprober System does have a dc/dt application that requires a frequency generator to perform the measurement, is not intended for sensing asynchronous signals.

Thus, there is a need in the industry for high speed test system that can acquire both AC and DC signals in a vacuum environment.

SUMMARY OF THE INVENTION

In accordance with one aspect of the present invention, features of a non-vacuum AC/DC probe system are combined with features of vacuum DC probe system to provide an AC/DC probe system for electronic circuits that can be used in a vacuum environment, such as, for example, in a SEM vacuum chamber.

In accordance with a second aspect of the present invention, features of a vacuum DC probe system are modified to include new op-amp circuitry that provides high speed AC/DC testing functionality, resulting in an AC/DC probe system for electronic circuits that can be used in a vacuum environment The features and advantages of the various aspects of the present invention will be more fully understood and appreciated upon consideration of the following detailed description of the invention and the accompanying drawings, which set forth illustrative embodiments in which the principles of the invention are utilized.

DETAILED DESCRIPTION OF THE INVENTION

Figure 1:
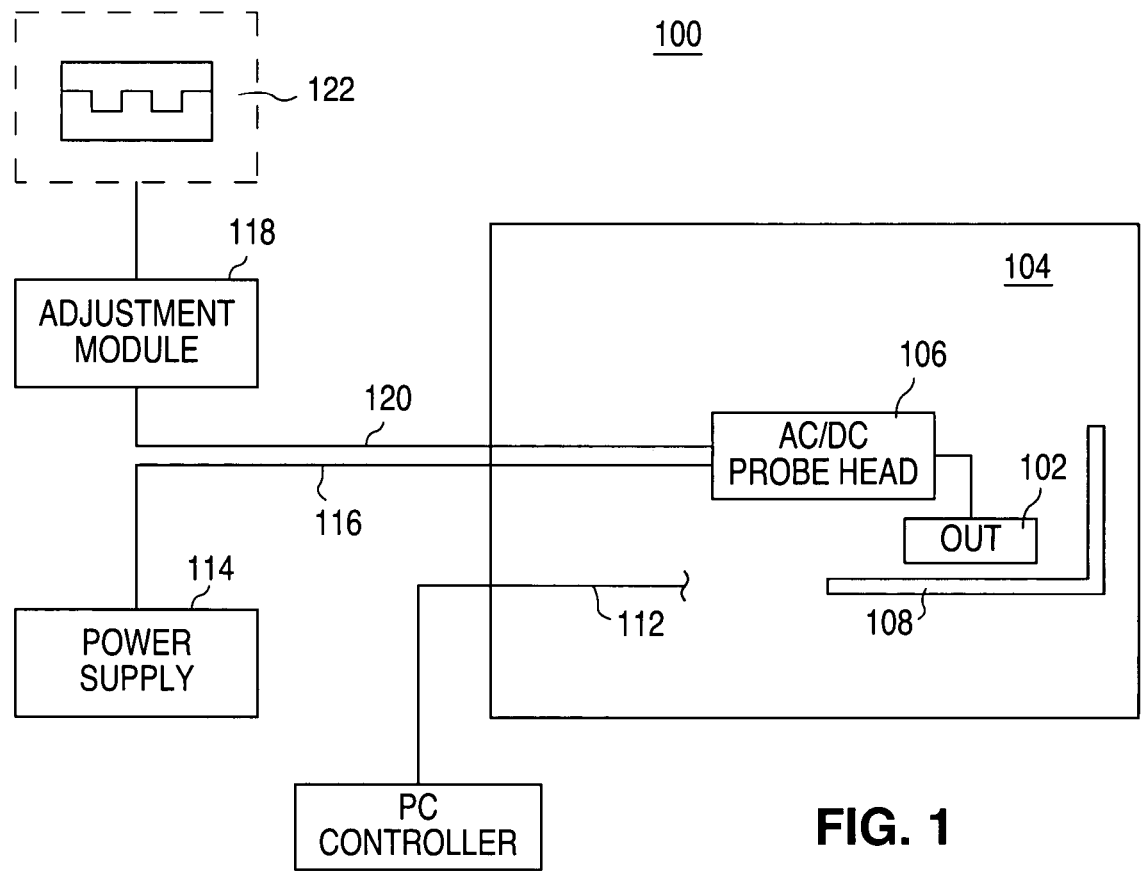
FIG. 1 is a block diagram illustrating a vacuum chamber AC/DC probe system in accordance with the concepts of the present invention.

FIG. 1 shows the basic elements of a vacuum chamber AC/DC probe system 100 for acquiring signals from an electronic device-under-test (DUT) 102 located in a vacuum chamber 104, such as, for example the vacuum chamber of a scanning electron microscope (SEM) system. As shown in FIG. 1, the vacuum chamber AC/DC probe system 100 includes a probe head 106 that is disposed within the vacuum chamber 104. The probe head 106 includes electronics, describe in greater detail below, for acquiring both AC signals and DC signals from the DUT 102. The DUT 102 is mounted on a stage 108 that can be adjusted to bring the probe head 106 selectively into contact with desired probe points in electrical circuitry formed as part of the DUT 102. Adjustments to the stage 108 are controlled by a control unit, such as a conventional personal computer 110 that is adapted for this purpose in accordance with concepts well know to those skilled in the art. The personal computer 110 is connected to the stage 108 via a conventional feedthrough transmission medium 112, such as USB, SPI or low-capacitance co-axial cable.

As further shown in FIG. 1, the probe head 106 receives power from an external power supply 114 via a DC wire bundle 116. The probe head 106 provides the AC signals and DC signals acquired from the DUT 102 to a control and adjustment module 118 via a feedthrough co-axial cable 120. The control and adjustment module 118 provides the AC/DC signals acquired by the probe head 106 to a test unit 122, e.g., an oscilloscope.

Figure 2:
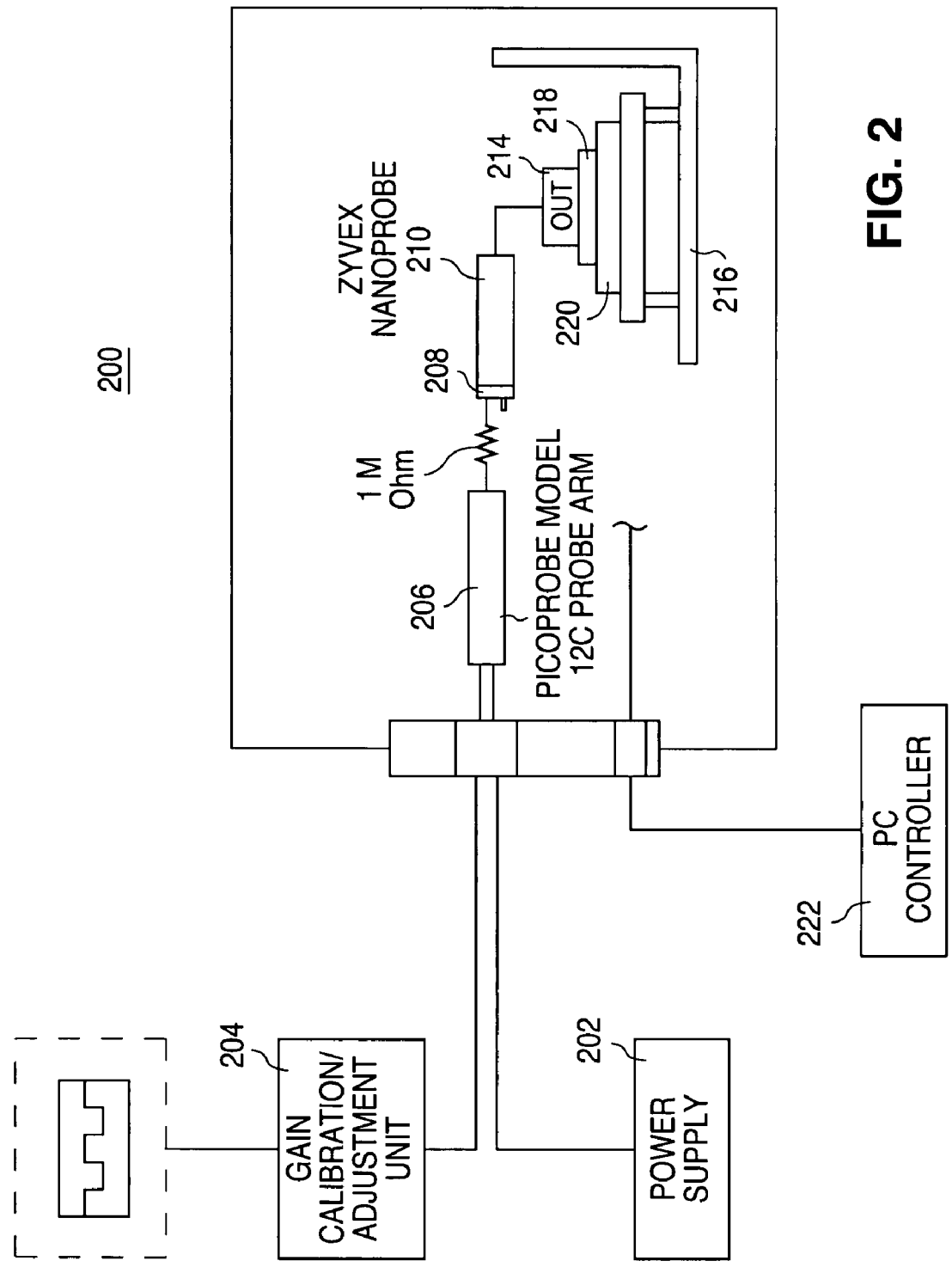
FIG. 2 is a block diagram illustrating a more detailed embodiment of a vacuum chamber AC/DC probe system in accordance with the concepts of the present invention.
Figure 2A:
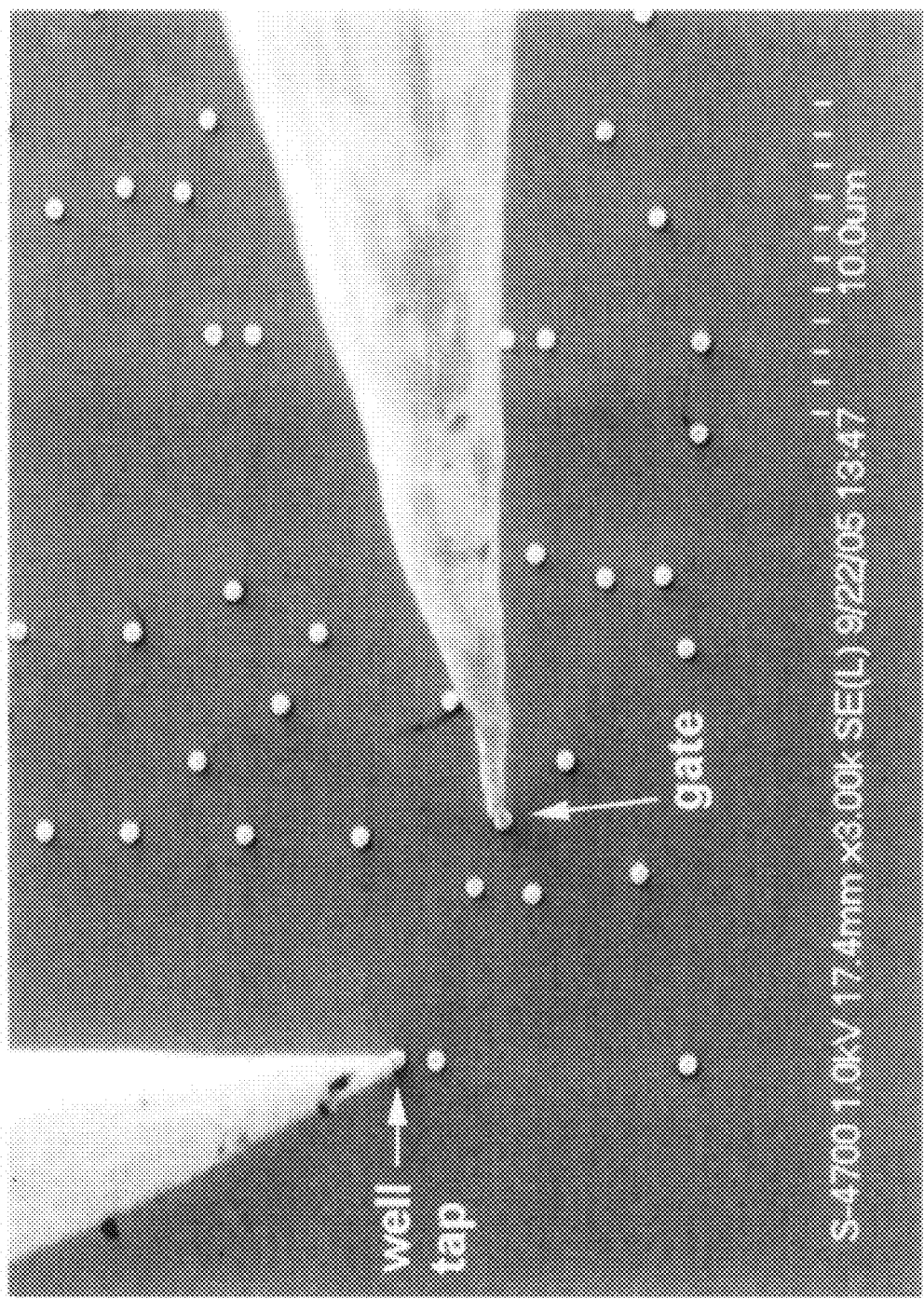
FIG. 2A is a photograph illustrating a two-probe probe head that can be utilized in practicing the concepts of the present invention.

FIG. 2 shows a more detailed embodiment 200 of the present invention that combines components from a Pico-Probe Model 12C non-vacuum AC/DC probe system with a probe head from a Zyvex DC vacuum probe system to provide a high speed, vacuum chamber AC/DC probe system in accordance with the present invention. The vacuum chamber AC/DC probe system 200 includes a power supply 202, gain calibration/adjustment unit 204, DC offset and Model 12C probe arm 206 of the type utilized in the Picoprobe Model 12C. As shown in FIG. 2, an adaptor 208, described in greater detail below, is provided to connect a four-probe Zyvex Nanoprobe probe head 210, preferably with 50 nm probe tips, to the Model 12C probe arm 206 via a 1M Ohm resistor 212. The active Nanoprobe probe head 210 is brought into contact with selected probed points of a device-under-test (DUT) 214 mounted on a moveable stage 216. In the FIG. 2 embodiment, the DUT is mounted on a test socket 218 formed on a circuit board 220. The stage 216 is drive by a PC controller 222. The Model 12C probe arm 206 is powered by the external Picoprobe power supply 202. The PicoProbe gain calibration/adjustment unit 204 sends the AC/DC signals acquired by the Nanoprobe head 210, and provided via the Model 12C probe arm 206, to a test system 224, e.g., an oscilloscope. The probe stage is elevated above the SEM sample stage to allow for inserting devices and/or boars, including cabling, under the probes for top down access from the probes to the boards/devices. FIG. 2A shows a two-probe Zyvex probe head that uses 200 nm training probes and that can be utilized in practicing the concepts of the present invention.

Because of the limitations of the PicoProbe Model 12C probe head, the FIG. 2 embodiment of the invention is limited to 500 Mhz bandwidth.

Figure 3B:
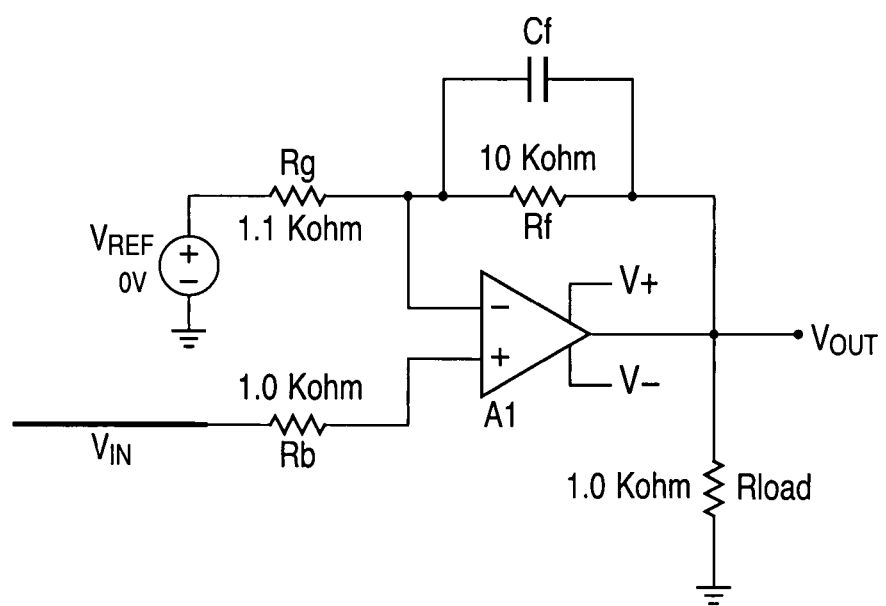
FIG. 3B is a stand-alone schematic drawing illustrating the operational amplifier circuit shown in the FIG. 3A.
Figure 3:
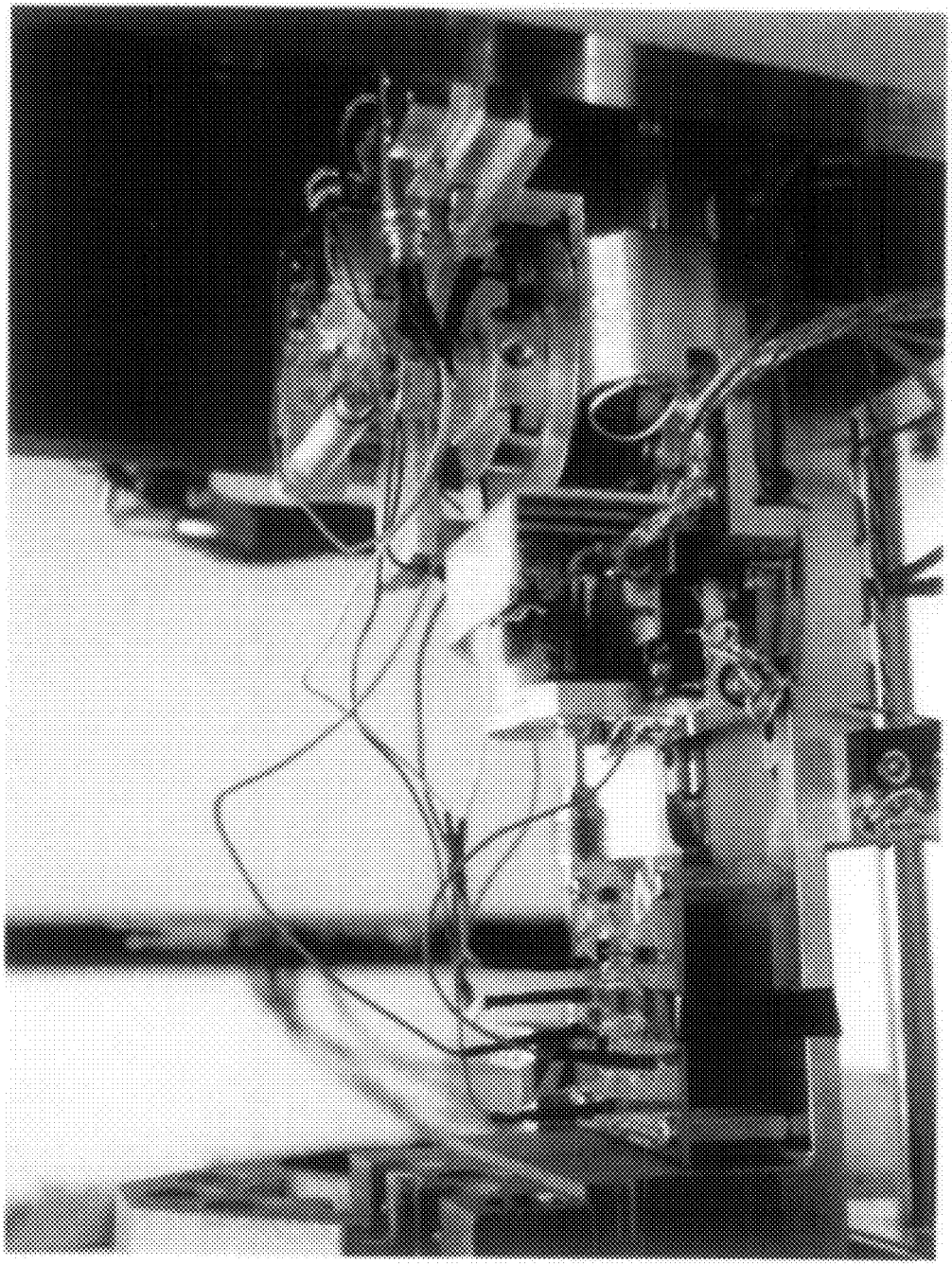
FIG. 3 is a photograph illustrating an embodiment of a vacuum chamber AC/DC probe system in accordance with the concepts of the present invention.

FIG. 3 shows an embodiment of the present invention in which a conventional Zyvex IC Nanoprobe System, which, as discussed above, has only DC vacuum capability, is modified to provide a high speed, vacuum chamber AC/DC probe system. More specifically, Zyvex probes that have 50 nm probe tip capability are used and modified to include an operational amplifier board that performs the same AC/DC signal acquisition function as the Picoprobe Model 12C probe arm discussed above.

Those skilled in the art will appreciate that the bandwidth capability of the FIG. 3 embodiment of the invention is limited only by the design of the operational amplifier.

Figure 3A:
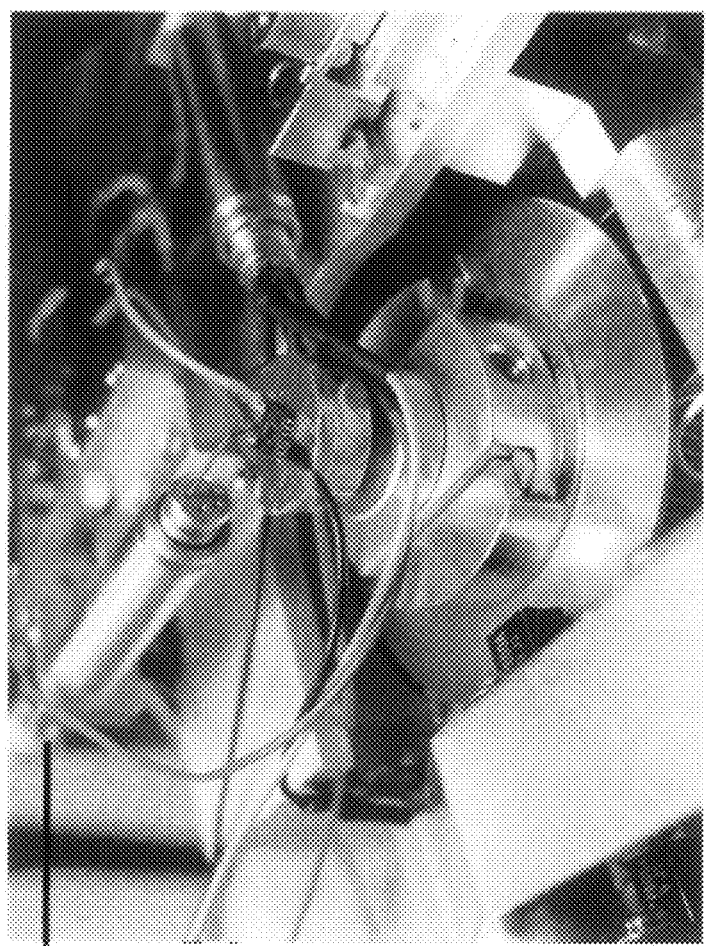
FIG. 3A is combined photograph and schematic drawing illustrating more detail of the FIG. 3 AC/DC probe system and an operational amplifier design that can be utilized in the AC/DC probe design.
Figure 3A:
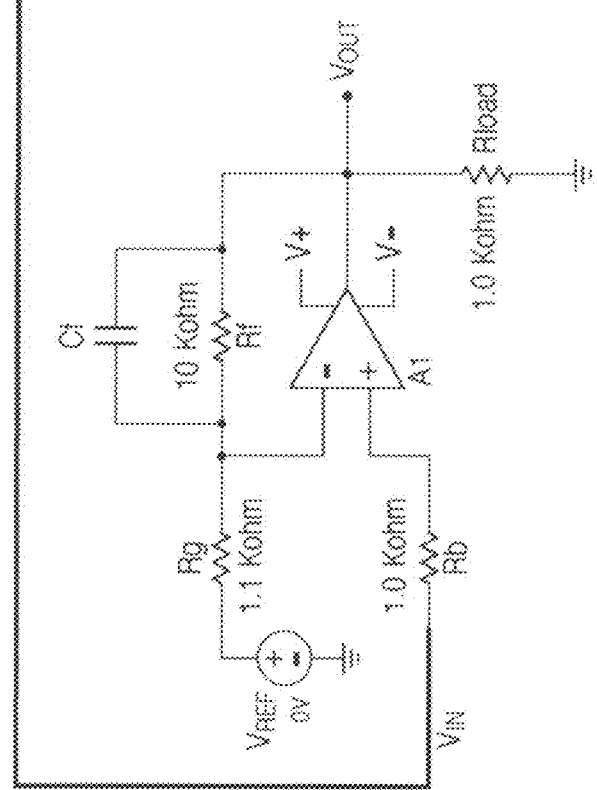

FIG. 3A shows a more detailed version of the FIG. 3 probe system design.

FIG. 3B shows an embodiment of an op-amp circuit that can be utilized in the FIG. 3 embodiment of the invention. Those skilled in the art will appreciate that a number of operational amplifier designs are suitable for this application.

It should be understood that the particular embodiments of the invention described above have been provided by way of example and that other modifications may occur to those skilled in the art without departing from the scope and spirit of the invention as express in the appended claims and their equivalents.

What is claimed is:

1. A vacuum chamber AC/DC probe system for acquiring voltage signals from electrical circuitry that is located within a vacuum chamber, the probe system comprising:
   (a) a probe head adapted for location within the vacuum chamber, the probe head including electronics for acquiring both AC voltage signals and DC voltage signals from the electrical circuitry, the probe head including a non-vacuum AC/DC probe system
   a vacuum DC probe head; and
   an operational amplifier formed as part of the vacuum DC probe head, the operational amplifier being adapted to render the vacuum DC probe head capable of acquiring AC voltage and DC voltage signals from the electrical circuitry, the AC voltage signals and the DC voltage signals being compatible with the non-vacuum AC/DC probe system;
   (b) a power supply connected to the probe head to provide power to the probe head; and
   (c) a control and adjustment module connected to the probe head to receive the AC voltage signals and the DC voltage signals from the probe head and to provide the AC voltage signals and the DC voltage signals to a test unit.

2. A vacuum chamber AC/DC probe system as in claim 1, and wherein the electrical circuitry is mounted on a stage located within the vacuum chamber, the stage being moveable with respect to the probe head.

3. A vacuum chamber AC/DC probe system as in claim 2, and wherein the stage is connected to a control unit that controls the movement of the stage.

4. A vacuum chamber AC/DC probe system as in claim 3, and wherein the control unit comprises a general purpose computer located outside the vacuum chamber.

5. A vacuum chamber AC/DC probe system as in claim 1, and wherein the non-vacuum AC/DC probe system is adapted to provide the AC voltage signals and DC voltage signals acquired from the electrical circuitry to the test unit.

6. A vacuum chamber AC/DC probe system as in claim 5, and wherein the test unit comprises an oscilloscope.

7. A vacuum chamber AC/DC probe system for acquiring voltage signals from electrical circuitry mounted on a stage that is located within a vacuum chamber, the AC/DC probe system comprising:
   a probe head adapted for location with the vacuum chamber, the probe head including a non-vacuum AC/DC probe system, a vacuum DC probe head that includes an operational amplifier that enables the DC probe head to acquire both AC and DC voltage signals from the electrical circuitry and provide the acquired AC voltage signals and the acquired DC voltage signals to a test unit via the non-vacuum AC/DC probe system;
   a power supply connected to provide power to the probe head; and
   a test unit located outside the vacuum chamber and connected to receive the acquired AC voltage signals and DC voltage signals from the probe head.

* * * * *